United States Patent [19]

Hilton

[11] Patent Number: 5,282,172
[45] Date of Patent: Jan. 25, 1994

[54] LOOK-AHEAD CIRCUIT FOR FAST DECODE OF BANKSELECT SIGNALS IN EMS SYSTEMS

[75] Inventor: William K. Hilton, Phoenix, Ariz.

[73] Assignee: VLSI Technology, Inc., San Jose, Calif.

[21] Appl. No.: 659,801

[22] Filed: Feb. 22, 1991

[51] Int. Cl.⁵ .................. G06F 12/00; G06F 12/06; G11C 8/00
[52] U.S. Cl. .................. 365/230.03; 365/230.06; 395/400; 395/425
[58] Field of Search .............. 395/425, 400; 365/230.03, 23.06; 364/DIG. 1 MS File

[56] References Cited

U.S. PATENT DOCUMENTS

| | | | |
|---|---|---|---|
| 3,970,999 | 7/1976 | Elward | 364/200 |
| 4,340,932 | 7/1982 | Bakula | 364/200 |
| 4,744,025 | 5/1988 | Lipcon | 364/200 |
| 4,891,752 | 1/1990 | Fairman et al. | 364/200 |
| 4,931,923 | 6/1990 | Fitch et al. | 364/200 |
| 4,967,397 | 10/1990 | Walck | 365/230.03 |
| 4,979,148 | 12/1990 | Bush et al. | 365/230.03 |
| 4,985,871 | 1/1991 | Catlin | 365/230.03 X |
| 5,012,408 | 4/1991 | Conroy | 365/230.03 |
| 5,036,493 | 7/1991 | Nielsen | 365/230.06 |
| 5,042,003 | 8/1991 | Belt et al. | 364/DIG. 2 |
| 5,161,218 | 11/1992 | Catlin | 365/230.06 X |
| 5,175,836 | 12/1992 | Morgan | 395/425 |
| 5,179,686 | 1/1993 | White | 395/425 |

*Primary Examiner*—Alyssa H. Bowler
*Attorney, Agent, or Firm*—Harry M. Weiss

[57] ABSTRACT

A method and apparatus for encoding expanded memory specification addresses and the bankselect signals associated therewith is disclosed. A 13th bit is provided and stores information as to the bankselect for the 12 bits of the expanded memory specification address. When the expanded memory specification register is accessed, the foregoing 13th bit is also retrieved and decoded to provide the proper bankselect decode signal.

4 Claims, 3 Drawing Sheets

• • •
• • • ARRAY FOR ONE REGISTER IS 12 BITS WIDE, DBUS(11:0)
• • •       MAPS TO EMS_ADDRESS(25:14)

LOOK-AHEAD CIRCUIT FOR FAST DECODE OF BANKSELECT SIGNALS IN EMS SYSTEMS

TECHNICAL FIELD

The present invention relates, in general, to decoding bankselect signals in an expanded memory specification system and, more particularly, to a circuit which minimizes the inherent time delays in decoding an address to generate bankselect signals in an EMS system.

BACKGROUND ART

When microcomputers were introduced, as little as 16 Kbytes of memory resided in the central processing units. Eventually, a fully expanded 8-bit processor offered 64 Kbytes of addressable memory, which was very adequate for users needs. The subsequent development of personal computers resulted in computers having typically ten times the system memory of the foregoing microcomputers and employing a powerful disk operating system (DOS) which was quickly recognized as the standard of the industry. One of the basic limitations of DOS is that it operates within the 1 megabyte limit with no capability for utilizing memory beyond this limit. In order to solve the problems associated with this memory limitation, expanded memory specification (EMS) was developed. The 1 megabyte address space was divided into random access memory from 0 to 640 Kbytes leaving 384 Kbytes of memory remaining. This 384 Kbyte portion of memory was divided into six equal portions of 64 Kbytes of memory each referred to as A, B, C, D, E and F for their hexadecimal representations. These portions of memory are typically used for various purposes. For example, portions E and F are reserved for BIOS ROM memory, while video adapters and other interface adapters are placed into other portions. Expanded memory specification (EMS) utilizes three of these portions, i.e., portions C, D, and E. Basically, EMS translates an address below 1 Mbyte into memory above 1 Mbyte, thus bypassing the foregoing DOS limitation. A problem arises, however, in that the prior art approaches for accessing and decoding EMS bankselect signals have inherent time delays resulting in the system operating at a lower clock frequency. In those cases where the accessing and decoding operations could not be accomplished rapidly enough, the prior art solution was to disallow EMS at fast clock speeds or to force start delays.

Because of the inherent time delays associated with prior art approaches for accessing and decoding EMS signals, it has become desirable to develop a system for decoding bankselect signals in EMS systems which minimizes such delays and which can be operated at high frequencies, such as 33 megahertz, within a complex memory map structure.

SUMMARY OF THE INVENTION

The present invention solves the problems associated with the prior art and other problems by providing a circuit which increases the speed of EMS accesses and the decoding of EMS bankselect signals by encoding the eventual bankselect signal and storing same as one additional bit with the EMS address. Thus, the resulting EMS array is 72 words deep and 13 bits wide, with the 13th bit storing information that predicts the bankselect for the 12 bits of EMS address associated therewith. When the EMS register is accessed during an EMS cycle, the 13th bit is also retrieved and decoded to provide the proper bankselect decode signal much more rapidly than in the prior art systems.

DESCRIPTION OF THE PREFERRED EMBODIMENT

Figure 1:
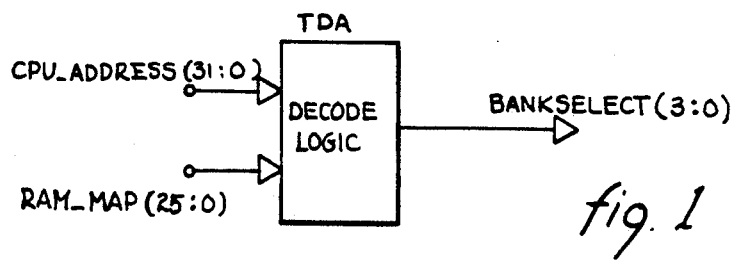
FIG. 1 is a schematic drawing illustrating the decoding of a CPU address to produce bankselect signals in a non-EMS system.

In IBM PC/AT compatible systems, different size memory maps are supported. A relatively small, inexpensive system may require only one megabyte of on-board dynamic random access memory (DRAM) while a larger, more powerful system can require up to 64 megabytes of such memory in an array of DRAMs. Such an array may include four banks of DRAMs each comprising three DRAM sizes (256 Kbyte, 1 Mbyte and 4 Mbyte), each DRAM size requiring a different number of address lines. The memory controller utilized supports twenty-five (25) different memory map options, each memory map (or ram map) consisting of from one to four banks of either 256 Kbyte, 1 Mbyte or 4 Mbyte DRAM chips. A "bank" is an array of DRAMs that share the same row address strobe (RAS) signal.

As an example, consider ram map #5 (memory option 5) shown in Table 1. This ram map contains two banks of DRAM memory. Bank 0 consists of 256 Kbyte DRAMs arranged as a 36×1 array for four 8-bit bytes of data plus four parity bits, for a total of 1 megabyte of memory. Bank 1 consists of 1 Mbyte DRAMs arranged as a 36×1 array for a total of 4 megabytes of memory. Banks 2 and 3 are not used in this ram map so that the total available memory is 5 megabytes, with addresses from 0 to 1 Mbytes accessing bank 0 and addresses from 1 Mbyte to 5 Mbyte accessing bank 1. Addresses above 5 Mbyte do not generate any bankselect signals in this ram map. In an 80386DX system, the CPU has 32 address bits which, in a non-EMS system, define the current CPU address. Thus, for ram map #5, CPU addresses between 0000 0000h and 000F FFFFh, or from 0 to 1 Mbyte, access bank 0, while CPU addresses from 0010 0000h and 004F FFFFh, or from 1 Mbyte to 5 Mbyte, access bank 1.

The time required to decode a CPU address in order to generate the proper bankselect signal is a critical parameter since it affects overall system performance. If an inordinate amount of time is required for decoding, then an additional "wait state" may be required to ensure proper timing between the controller and the DRAMs. This "wait state" impedes system performance and should be minimized.

Referring now to FIG. 1, a schematic drawing illustrating the decoding of CPU addresses to produce bankselect signals in a non-EMS system is shown. The CPU addresses, shown as CPU A [31:0], are decoded with information that defines the ram map (memory map option) selected. After a time delay, shown as tda (which is about 15 ns), one of the four banks of DRAMs will be accessed if the CPU address is a valid memory address.

Figure 2:
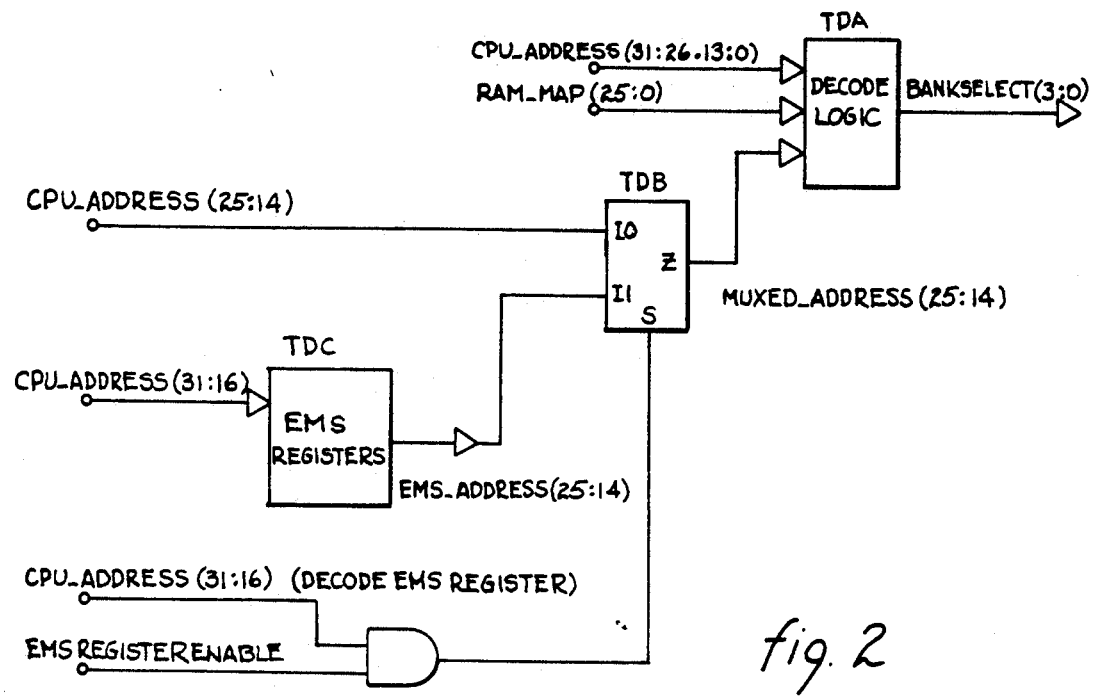
FIG. 2 is a logic diagram illustrating a prior art approach of decoding addresses to produce bankselect signals in an EMS system.

The addition of expanded memory specification (EMS) makes the decoding of addresses to generate bankselect signals much more complex. If EMS is used, the CPU address cannot be decoded directly since the EMS register contains the actual final memory address. When EMS is accessed, the address is always below 1 Mbyte since all of the EMS registers are located between 256 Kbyte to 640 Kbyte and 768 Kbyte to 960 Kbyte in the memory. The EMS registers, however, are typically loaded with addresses that point to memory locations above 1 Mbyte. As previously explained, the rationale for developing EMS was to circumvent the 1 Mbyte limitation of DOS. Thus, if the CPU address is decoded as in FIG. 1, all CPU accesses to the EMS registers would decode as bank 0 if ram map #5 is selected, even though the actual bank selected via EMS could be either bank 0 or bank 1, depending on what is stored in the accessed EMS register. Previous attempts to solve this problem relied on retrieving the EMS address and decoding same to produce the proper bankselect signal. A block diagram of the logic of such prior art approaches is illustrated in FIG. 2. A comparison of FIG. 2 to FIG. 1, reveals that two additional time delays (tdb and tdc) have been added in FIG. 2. Instead of decoding the CPU address, address bits [25:14] must be multiplexed into the decode logic. The foregoing address bits [25:14] are provided from either the CPU (if the current access is not EMS) or the retrieved EMS register. Time delay tdb is approximately 4 ns, however, time delay tdc, i.e., the access time to retrieve the EMS address from the EMS register, is approximately 12 ns, so that the total time delay comprising delays tda, tdb and tdc, for this circuit is approximately twice that of the circuit illustrated in FIG. 1. This additional time delay causes a loss in performance due to the extra "wait state" involved.

The purpose of the present invention is to minimize the foregoing time delays when the system uses the expanded memory specification. The present invention accomplishes the foregoing by encoding the eventual bankselect signal and storing same as one additional bit when the EMS address is written into its associated register. That is, instead of an EMS array of 72 words deep and 12 bits wide, with the present invention, the array is 72 words deep by 13 bits wide, with the 13th bit storing information that predicts the bankselect for the 12 bits of EMS address associated therewith. Thus, when the EMS register is accessed and retrieved during an EMS cycle, the additional bit is also retrieved and decoded to provide the proper bankselect decode signal much more rapidly than with the logic illustrated in FIG. 2.

Figure 3:
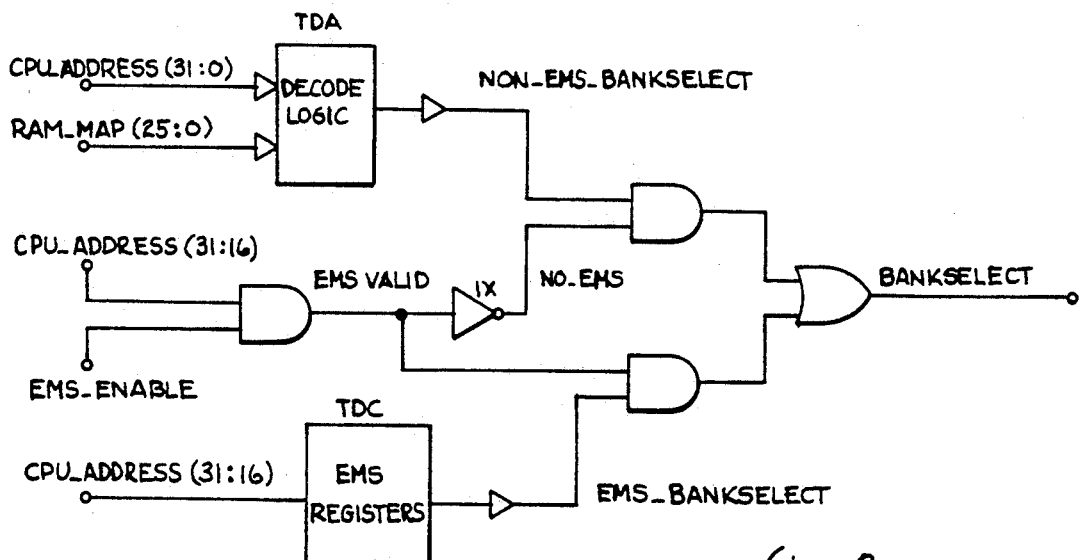
FIG. 3 is a logic diagram of the present invention and illustrates the logic associated with the decoding of bankselect signals in an EMS system.

As an example of the foregoing, again using ram map #5 and referring to Table 2, when the EMS address is stored, the bankselect bit is set high if any of the bits D[8:6] are high since these bits define EMS addresses A [22:20]. If any of these bits (A [22:20]) are high, then the subsequent EMS access to this address will be directed to bank 1 since the EMS address is above 1 Mbyte. If all of the foregoing bits are 0, then the EMS address is less than 1 Mbyte, and hence bank 0 is accessed. By storing the foregoing information and then retrieving same when the EMS address is retrieved, the time to decode is significantly reduced since only one bit is accessed from the EMS register, thus bypassing time delay tda. Referring now to FIG. 3 which illustrates the logic depicting the present invention, it should be noted that time delays tda and tdc are in parallel instead of being in the same serial path, as in FIG. 2, thus further reducing the inherent time delay in this circuit.

Figure 4:
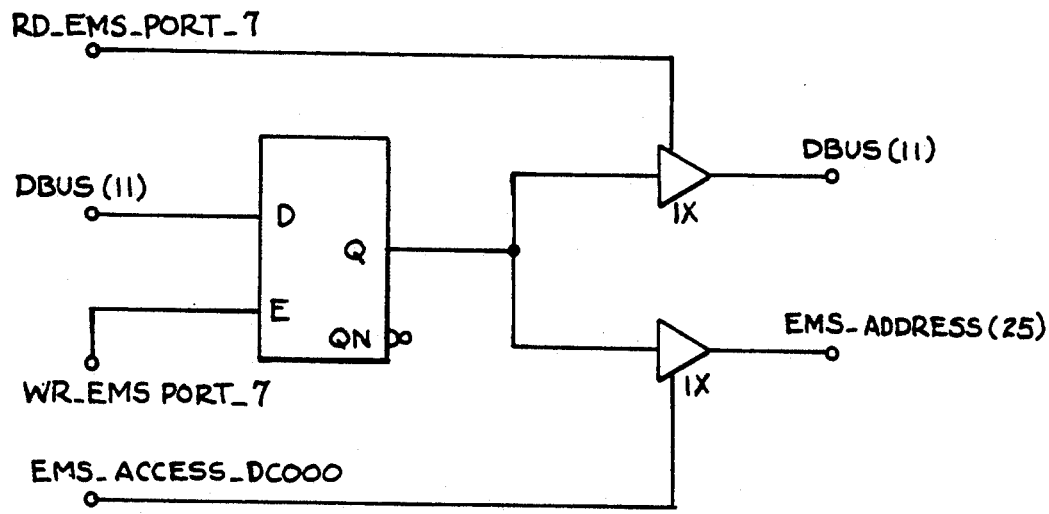
FIG. 4 illustrates a typical EMS 12-bit register.
Figure 4:
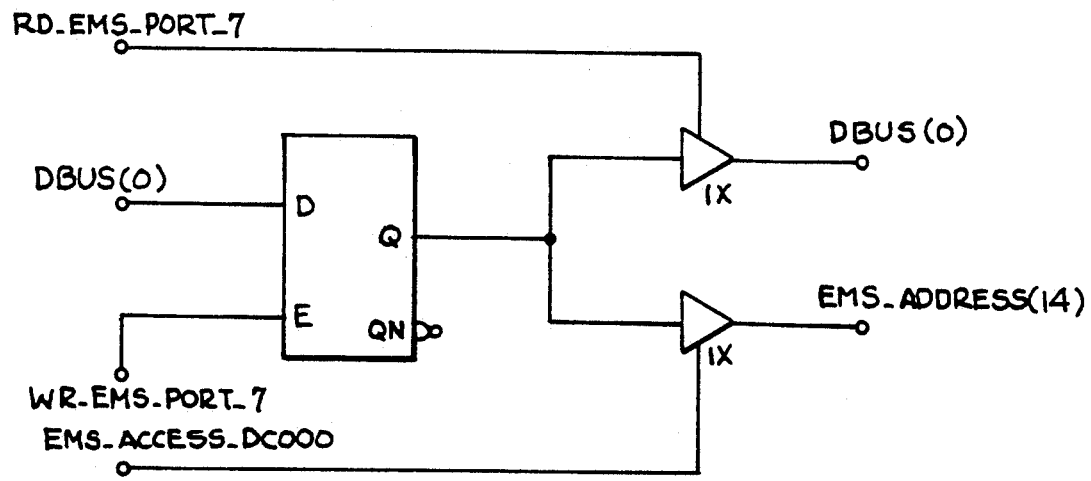

Referring now to FIG. 4, the organization of a typical EMS register is illustrated. Using port 7 as an example, the eventual EMS address is loaded from the dbus [11:0] into the EMS register on a "write" to port 7. Referring again to Table 2, during an EMS access at address 000d c000h, the contents are retrieved and become the new physical address. The present invention adds a 13th bit to store the predicted bankselect.

Figure 5:
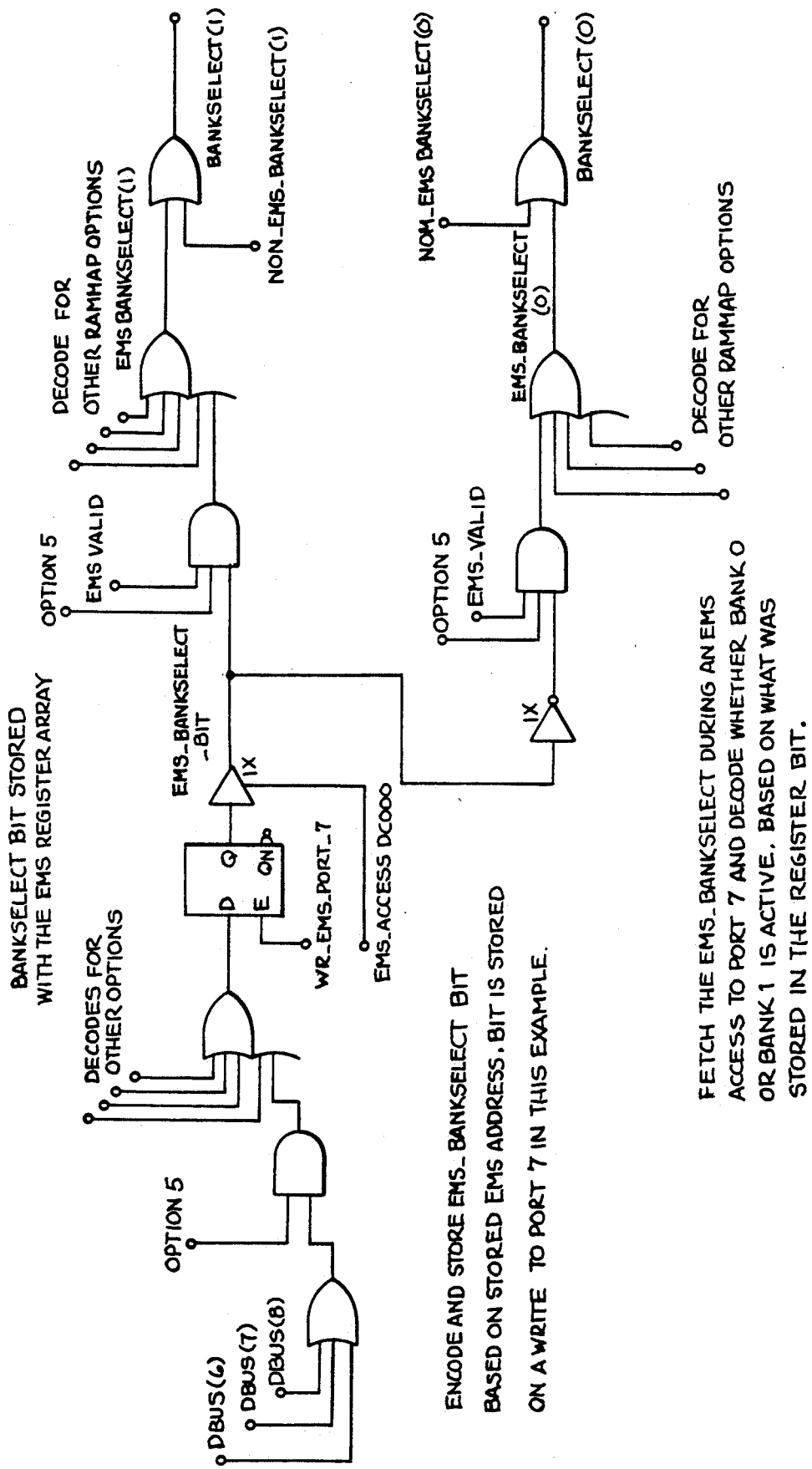
FIG. 5 is a logic diagram of the encoding and subsequent decoding of EMS bankselect signals for a particular memory map option utilizing the present invention.

Referring now to FIG. 5, this Figure illustrates the logic that might be utilized to implement the encoding of ram map #5, the storing of the 13th bit and the subsequent decoding of this bit when the EMS register is accessed. Since the tdc time delay associated with accessing the EMS register in FIG. 3 is done in parallel with the tda time delay, the longest time delay is approximately 17 ns representing a 15 ns time delay for either tdc or tda time delays, plus a delay for the two gates generating the bankselect signals. Thus, no additional time delay arises as in the case illustrated in FIG. 2 which included three time delays (tda, tdb and tdc). Therefore, no additional "wait states" are involved resulting in an improvement in system performance. It should be noted that similar logic would be required for each of the other ram maps, but the operation of same would be similar to that heretofore described.

Certain modifications and improvements will occur to those skilled in the art upon reading the foregoing It should be understood that all such modifications and improvements have been deleted herein for the sake of conciseness and readability, but are properly within the scope of the following claims.

TABLE 1

| BANK 0 | BANK 1 | BANK 2 | BANK 3 | MEMORY | RAMMAP (0-4) |
|---|---|---|---|---|---|
| 256K | — | — | — | 1.0MB | 0(1F*) |
| 256K | 256K | — | — | 2.0MB | 1 |
| 256K | 256K | 256K | — | 3.0MB | 2 |
| 256K | 256K | 256K | 256K | 4.0MB | 3 |
| 1M | — | — | — | 4.0MB | 4 |
| 256K | 1M | — | — | 5.0MB | 5 |
| 256K | 256K | 1M | — | 6.0MB | 6 |
| 1M | 1M | — | — | 8.0MB | 7 |
| 1M | 1M | 256K | — | 9.0MB | 8 |
| 256K | 256K | 1M | 1M | 10.0MB | 9 |
| 1M | 1M | 1M | — | 12.0MB | A |
| 1M | 1M | 1M | 1M | 16.0MB | B |
| 4M | — | — | — | 16.0MB | C |
| 256K | 4M | — | — | 17.0MB | D |
| 256K | 256K | 4M | — | 10.0MB | E |
| 1M | 4M | — | — | 20.0MB | F |
| 1M | 1M | 4M | — | 24.0MB | 10 |
| 4M | 4M | — | — | 32.0MB | 11 |
| 4M | 4M | 256K | — | 33.0MB | 12 |
| 256K | 256K | 4M | 4M | 34.0MB | 13 |
| 4M | 4M | 1M | — | 36.0MB | 14 |
| 1M | 1M | 4M | 4M | 40.0MB | 15 |
| 4M | 4M | 4M | — | 48.0MB | 16 |
| 4M | 4M | 4M | 4M | 64.0MB | 17 |

*1Fh is a special case of the 1M memory map. The 384K of DRAM above 640K are accessed between 100000h and 15FFFFh. EMS and shadow RAM unavailable in this mode. Memory map 0h allows EMS and shadowing but no extended memory. All other memory maps allow shadow, expanded, and extended memory.

TABLE 9

EMS INDEX REGISTER AND DATA PORT MAP

| C8h Index Port | D7 | D6 | D5 | D4 | D3 | D2 | D1 | D0 |
|---|---|---|---|---|---|---|---|---|
| | Set # | Auto-Inc | A5 | A4 | A3 | A2 | A1 | A0 |
| | 0 - Std | 0 - Off | | | | | | |
| | 1 - Alt | 1 - On | | | | | | |

TABLE 2

| Data Port | Page Segment | Data Port EGh ||||||||| Data Port EAh |||||||| 
|---|---|---|---|---|---|---|---|---|---|---|---|---|---|---|---|---|---|
| | | D15 | D14 | D13 | D12 | D11 | D10 | D9 | D8 | D7 | D6 | D5 | D4 | D3 | D2 | D1 | D0 |
| 0 | C0000 | 1 | 1 | 1 | 1 | A25 | A24 | A23 | A22 | A21 | A20 | A19 | A18 | A17 | A16 | A15 | A14 |
| 1 | C4000 | 1 | 1 | 1 | 1 | A25 | A24 | A23 | A22 | A21 | A20 | A19 | A18 | A17 | A16 | A15 | A14 |
| 2 | C8000 | 1 | 1 | 1 | 1 | A25 | A24 | A23 | A22 | A21 | A20 | A19 | A18 | A17 | A16 | A15 | A14 |
| 3 | CC000 | 1 | 1 | 1 | 1 | A25 | A24 | A23 | A22 | A21 | A20 | A19 | A18 | A17 | A16 | A15 | A14 |
| 4 | D0000 | 1 | 1 | 1 | 1 | A25 | A24 | A23 | A22 | A21 | A20 | A19 | A18 | A17 | A16 | A15 | A14 |
| 5 | D4000 | 1 | 1 | 1 | 1 | A25 | A24 | A23 | A22 | A21 | A20 | A19 | A18 | A17 | A16 | A15 | A14 |
| 6 | D8000 | 1 | 1 | 1 | 1 | A25 | A24 | A23 | A22 | A21 | A20 | A19 | A18 | A17 | A16 | A15 | A14 |
| 7 | DC000 | 1 | 1 | 1 | 1 | A25 | A24 | A23 | A22 | A21 | A20 | A19 | A18 | A17 | A16 | A15 | A14 |
| 8 | E0000 | 1 | 1 | 1 | 1 | A25 | A24 | A23 | A22 | A21 | A20 | A19 | A18 | A17 | A16 | A15 | A14 |
| 9 | E4000 | 1 | 1 | 1 | 1 | A25 | A24 | A23 | A22 | A21 | A20 | A19 | A18 | A17 | A16 | A15 | A14 |
| A | E8000 | 1 | 1 | 1 | 1 | A25 | A24 | A23 | A22 | A21 | A20 | A19 | A18 | A17 | A16 | A15 | A14 |
| B | EC000 | 1 | 1 | 1 | 1 | A25 | A24 | A23 | A22 | A21 | A20 | A19 | A18 | A17 | A16 | A15 | A14 |
| C | 40000 | 1 | 1 | 1 | 1 | A25 | A24 | A23 | A22 | A21 | A20 | A19 | A18 | A17 | A16 | A15 | A14 |
| D | 44000 | 1 | 1 | 1 | 1 | A25 | A24 | A23 | A22 | A21 | A20 | A19 | A18 | A17 | A16 | A15 | A14 |
| E | 48000 | 1 | 1 | 1 | 1 | A25 | A24 | A23 | A22 | A21 | A20 | A19 | A18 | A17 | A16 | A15 | A14 |
| F | 4C000 | 1 | 1 | 1 | 1 | A25 | A24 | A23 | A22 | A21 | A20 | A19 | A18 | A17 | A16 | A15 | A14 |
| 10 | 50000 | 1 | 1 | 1 | 1 | A25 | A24 | A23 | A22 | A21 | A20 | A19 | A18 | A17 | A16 | A15 | A14 |
| 11 | 54000 | 1 | 1 | 1 | 1 | A25 | A24 | A23 | A22 | A21 | A20 | A19 | A18 | A17 | A16 | A15 | A14 |
| 12 | 58000 | 1 | 1 | 1 | 1 | A25 | A24 | A23 | A22 | A21 | A20 | A19 | A18 | A17 | A16 | A15 | A14 |
| 13 | 5C000 | 1 | 1 | 1 | 1 | A25 | A24 | A23 | A22 | A21 | A20 | A19 | A18 | A17 | A16 | A15 | A14 |
| 14 | 60000 | 1 | 1 | 1 | 1 | A25 | A24 | A23 | A22 | A21 | A20 | A19 | A18 | A17 | A16 | A15 | A14 |
| 15 | 64000 | 1 | 1 | 1 | 1 | A25 | A24 | A23 | A22 | A21 | A20 | A19 | A18 | A17 | A16 | A15 | A14 |
| 16 | 68000 | 1 | 1 | 1 | 1 | A25 | A24 | A23 | A22 | A21 | A20 | A19 | A18 | A17 | A16 | A15 | A14 |
| 17 | 6C000 | 1 | 1 | 1 | 1 | A25 | A24 | A23 | A22 | A21 | A20 | A19 | A18 | A17 | A16 | A15 | A14 |
| 18 | 70000 | 1 | 1 | 1 | 1 | A25 | A24 | A23 | A22 | A21 | A20 | A19 | A18 | A17 | A16 | A15 | A14 |
| 19 | 74000 | 1 | 1 | 1 | 1 | A25 | A24 | A23 | A22 | A21 | A20 | A19 | A18 | A17 | A16 | A15 | A14 |
| 1A | 78000 | 1 | 1 | 1 | 1 | A25 | A24 | A23 | A22 | A21 | A20 | A19 | A18 | A17 | A16 | A15 | A14 |
| 1B | 7C000 | 1 | 1 | 1 | 1 | A25 | A24 | A23 | A22 | A21 | A20 | A19 | A18 | A17 | A16 | A15 | A14 |
| 1C | 80000 | 1 | 1 | 1 | 1 | A25 | A24 | A23 | A22 | A21 | A20 | A19 | A18 | A17 | A16 | A15 | A14 |
| 1D | 84000 | 1 | 1 | 1 | 1 | A25 | A24 | A23 | A22 | A21 | A20 | A19 | A18 | A17 | A16 | A15 | A14 |
| 1E | 88000 | 1 | 1 | 1 | 1 | A25 | A24 | A23 | A22 | A21 | A20 | A19 | A18 | A17 | A16 | A15 | A14 |
| 1F | 8C000 | 1 | 1 | 1 | 1 | A25 | A24 | A23 | A22 | A21 | A20 | A19 | A18 | A17 | A16 | A15 | A14 |
| 20 | 90000 | 1 | 1 | 1 | 1 | A25 | A24 | A23 | A22 | A21 | A20 | A19 | A18 | A17 | A16 | A15 | A14 |
| 21 | 94000 | 1 | 1 | 1 | 1 | A25 | A24 | A23 | A22 | A21 | A20 | A19 | A18 | A17 | A16 | A15 | A14 |
| 22 | 98000 | 1 | 1 | 1 | 1 | A25 | A24 | A23 | A22 | A21 | A20 | A19 | A18 | A17 | A16 | A15 | A14 |
| 23 | 9C000 | 1 | 1 | 1 | 1 | A25 | A24 | A23 | A22 | A21 | A20 | A19 | A18 | A17 | A16 | A15 | A14 |

Note: A 1 indicates reserved bits that read back as logic 1.

I claim:

1. A system for encoding a memory address and associated bankselect signals in an expanded memory specification arrangement comprising:

means for encoding an address in an expanded memory specification system, said address having a selection of memory banks associated therewith;

means for encoding selected memory banks associated with said address in the expanded memory specification system, said selected memory banks encoding means comprising an additional address bit added to said address in the expanded memory specification system, said additional address bit comprising said selected memory banks encoding means is a 13th bit added to a 12 bit address for which the additional bit is rapidly decoded to select a bank for which said 12 bit address of said expanded memory specification belongs;

means for combining said encoded address in the expanded memory specification system with said selected memory banks, said combining means producing a combined encoded address for said address in the expanded memory specification system; and means for storing said combined encoded address.

2. The apparatus as defined in claim 1 further including means for decoding said combined encoded address, actuation of said decoding means causing a bankselect signal to be transmitted to the selection of memory banks associated with said address in the expanded memory specification.

3. The apparatus as defined in claim 1 further including means for decoding said combined encoded address, said decoding means being actuatable in response to said additional address bit causing a bankselect signal to be transmitted to the selection of memory banks associated with said address in the expanded memory specification.

4. A method for encoding an address comprising the steps of:

encoding the address in an expanded memory specification register;

encoding a selection of memory banks associated with the address in the expanded memory specification register, said encoding of a selection of memory banks comprising an additional address bit added to said address in an encoded expanded memory specification register, said additional address bit comprising said encoding selection of memory banks is a 13th bit added to a 12 bit address for which the additional bit is rapidly decoded to select a bank for which said 12 bit address of said encoded expanded memory specification register belongs; and storing an encoded memory bank selection with said address of said encoded expanded memory specification register.

* * * * *